United States Patent
Yamamoto et al.

(10) Patent No.: US 6,916,873 B2
(45) Date of Patent: Jul. 12, 2005

(54) LIQUID THERMOSETTING RESIN COMPOSITION, PRINTED WIRING BOARDS AND PROCESS FOR THEIR PRODUCTION

(75) Inventors: Rieko Yamamoto, Niiza (JP); Norio Kimura, Kawagoe (JP); Kyoichi Yoda, Higashimatsuyama (JP); Yasukazu Watanabe, Hiki-gun (JP)

(73) Assignee: Taiyo Ink Manufacturning Co., Ltd. (JP)

( * ) Notice: Subject to any disclaimer, the term of this patent is extended or adjusted under 35 U.S.C. 154(b) by 0 days.

(21) Appl. No.: 10/284,304

(22) Filed: Oct. 31, 2002

(65) Prior Publication Data

US 2003/0129383 A1 Jul. 10, 2003

Related U.S. Application Data

(63) Continuation of application No. PCT/JP01/09955, filed on Nov. 14, 2001, now abandoned.

(30) Foreign Application Priority Data

Nov. 29, 2000 (JP) .......................................... 2000-363719

(51) Int. Cl.$^7$ ................................................. C08L 3/34
(52) U.S. Cl. ....................... 524/493; 524/492; 523/466; 523/220; 523/223
(58) Field of Search ................................ 524/493, 492; 523/466, 220, 223

(56) References Cited

U.S. PATENT DOCUMENTS 5,719,225 A * 2/1998 Hirano et al. ................ 524/493
6,177,490 B1 * 1/2001 Yoda et al. .................. 523/457

FOREIGN PATENT DOCUMENTS

| JP | 07-300517 | 11/1995 |
| JP | 11-286535 | 10/1999 |

OTHER PUBLICATIONS

International Search Report.

* cited by examiner

*Primary Examiner*—Ling-Sui Choi
(74) *Attorney, Agent, or Firm*—Rader, Fishman & Grauer, PLLC

(57) ABSTRACT

A liquid thermosetting resin composition comprises (A) an epoxy resin, (B) a curing catalyst, and (C) a filler and is characterized by exhibiting a viscosity at 25° C. of not more than 1,500 dPa.s, a gel time of not less than 300 seconds at a temperature at which the composition exhibits a melt viscosity of not more than 10 dPa.s, and a gel time at 130° C. of not more than 600 seconds. In the production of a printed wiring board by superposing an interlaminar resin insulating layer and a conductive circuit on the surface of the wiring board having a conductive circuit pattern including hole parts, a hole filling process is performed by filling the hole parts mentioned above with the composition mentioned above, effecting precure of the composition by heating, then polishing and removing parts of the precured composition protruding from a surface defining the hole parts, and further heating the precured composition till final curing.

20 Claims, 3 Drawing Sheets

LIQUID THERMOSETTING RESIN COMPOSITION, PRINTED WIRING BOARDS AND PROCESS FOR THEIR PRODUCTION

CROSS-REFERENCE TO RELATED APPLICATIONS

This is a continuation of Application PCT/JP01/09955, filed Nov. 14, 2001, now abandoned.

BACKGROUND OF THE INVENTION

1. Field of the Invention

This invention relates to a liquid thermosetting resin composition, particularly a liquid thermosetting resin composition which is useful as a composition for permanently filling such holes as via holes and through-holes in printed wiring boards or printed circuit boards such as multi-layer boards and double-sided boards. The liquid thermosetting resin composition of the present invention may also be used as various resists, interlaminar insulating materials, sealing compounds for IC packages, and the like.

The present invention further relates to a printed wiring board whose holes such as via holes and through-holes have been permanently filled by the use of the composition mentioned above and a process for the production thereof.

Incidentally, the term "hole part" as used in this specification refers collectively to a via hole, a through-hole, and the like formed in the course of production of the printed wiring board.

2. Description of the Prior Art

In recent years, the printed wiring boards have been advancing toward decreasing the width of pattern lines and decreasing a mounting area. Further, with a view to coping with the trend of devices provided with a printed wiring board toward decreasing size and increasing function, the desirability of producing printed wiring boards in further decreased weight and size has been finding growing recognition. As a result, the printed wiring boards are advancing in the direction of favoring the build-up process which comprises superposing resin insulating layers one each on the upper and the lower surface of a core substrate, forming necessary conductive circuits thereon, further repeating the superposition of resin insulating layers and the formation of conductive circuits, and so on and the mounting parts are advancing in the direction of favoring such an area array type as, for example, BGA (the ball grid array) and LGA (the land grid array). In such circumstances, the desirability of developing a composition to be used in permanently filling the hole parts such as through-holes and via holes and excelling in filling properties, polishability, and physical properties of a hardened product has been finding universal recognition.

As the composition for permanently filling such holes in printed wiring boards, in general the epoxy resin compositions of the thermosetting type have been widely used because their hardened products excel in mechanical, electrical, and chemical properties, and exhibit good adhesiveness as well.

Further, the process for permanently filling holes in a printed wiring board by the use of such an epoxy resin composition comprises in general a step of filling the hole parts of the printed wiring board with the epoxy resin composition, a step of heating the composition filled in the hole parts thereby effecting precure of the composition to a polishable state, polishing and removing the parts of the precured composition which protrudes from the surface defining the hole parts, and further heating the precured composition till final curing.

In this process for permanently filling holes in a printed wiring board, when the hole parts such as through-holes and via holes of the printed wiring board are filled with the epoxy resin composition, the filled composition inevitably gives rise to voids due to such phenomena as air entrapment. It was hardly possible to completely remove or vanish such voids even when the precure and the final cure are performed. Such phenomena were remarkable in proportion as the depth of the hole part increases (in the case of the through-hole, as the thickness of the core substrate increases) and as the viscosity of the epoxy resin composition becomes higher. Further, in the process for permanently filling holes in a printed wiring board mentioned above, there was another problem of the occurrence of cracks during the step of precure.

Moreover, there was another problem that the composition shrinks largely during the course of thermal curing and the finally cured composition gives birth to a gap between itself and the wall of the through-hole.

When such defects as voids and cracks occur in the cured products of the resin composition filled in the hole parts in a printed wiring board, these parts exhibit hygroscopicity, and the printed wiring board suffers from the decrease of PCT resistance (pressure cooker resistance) under the conditions of high temperature and high humidity and brings about the occurrence of cracks and deterioration of insulation reliability during the course of heat cycle of the printed wiring board. Moreover, these defects also becomes the cause of ply separation of the insulating resin layer or cover plating formed on the cured products filled in the hole parts.

SUMMARY OF THE INVENTION

Accordingly, the present invention has been made in view of the circumstances mentioned above and its fundamental object is to provide a liquid thermosetting resin composition which is excellent in filling properties (operational efficiency) into hole parts such as via holes and through-holes of a printed wiring board, does not suffer from the retention of voids and the occurrence of cracks, causes only sparingly shrinkage on curing, and ultimately forms a cured product producing low volume expansion under the conditions of high temperature and high humidity and excelling in insulating reliability, resistance to heat, resistance to moisture, PCT resistance, etc.

A further object of the present invention is to provide a highly reliable printed wiring board which is excellent in various properties such as insulating reliability, resistance to heat, resistance to moisture, and PCT resistance and does not suffer from such defects as the occurrence of cracks and deterioration of insulation reliability during the course of heat cycle and the ply separation of the insulating resin layer or cover plating formed on the cured products filled in the hole parts.

Another object of the present invention is to provide a method which is capable of producing a highly reliable printed wiring board as mentioned above with high operational efficiency and high productivity.

To accomplish the objects mentioned above, in accordance with a first aspect of the present invention, there is provided a liquid thermosetting resin composition comprising (A) an epoxy resin which is in a liquid state at room temperature, (B) a curing catalyst, and (C) a filler, which is characterized by exhibiting a viscosity at 25° C. of not more than 1,500 dPa.s, a gel time of not less than 300 seconds at
} a temperature at which the composition exhibits a melt viscosity of not more than 10 dPa.s, and a gel time at 130° C. of not more than 600 seconds.

In a preferred embodiment, the composition contains a spherical filler and a ground filler as the filler (C) mentioned above. In a more preferred embodiment, the composition contains (D) a coupling agent in addition to the above components (A) to (C).

The term "gel time" mentioned above refers to a time during which the torque measured by rotating a rotary rod in 0.4 ml of a sample kept at a measuring temperature with a gelation tester in accordance with a hot plate method specified in JIS (Japanese Industrial Standard) C 2105 18.2 reaches a value of 30% of the maximum torque.

Further, the term "melt viscosity" mentioned above refers to the viscosity measured by a flow tester (hole diameter of die: 1.0 mm, length of die: 10 mm) while applying a load of 1 kg with a piston on 2 ml of a sample kept at a measuring temperature after preheating for five minutes.

Since the liquid thermosetting resin composition mentioned above exhibits a viscosity at 25° C. of not more than 1,500 dPa.s, a gel time of not less than 300 seconds at a temperature at which the composition exhibits a melt viscosity of not more than 10 dPa.s, and a gel time at 130° C. of not more than 600 seconds, it has specific effects such that it is excellent in filling properties (operational efficiency) into hole parts such as via holes and through-holes of a printed wiring board and does not suffer from the retention of voids and the occurrence of cracks. Further, the composition allows the incorporation therein of a large amount of a filler, causes only sparingly shrinkage on curing, and ultimately forms a cured product which exhibits low hygroscopicity, excellent adhesiveness, and low volume expansion under the conditions of high temperature and high humidity and excels in insulating reliability, resistance to heat, resistance to moisture, PCT resistance, etc.

In accordance with a second aspect of the present invention, there is provided a printed wiring board having a conductive circuit formed on a substrate through the medium of an interlaminar resin insulating layer and a hole part filled with a filling material, which is characterized in that the filling material filled in the hole part mentioned above is formed from a cured product of the liquid thermosetting resin composition mentioned above.

Further, in accordance with a third aspect of the present invention, there is provided a process for the production of a printed wiring board by superposing an interlaminar resin insulating layer and a conductive circuit on a surface of the wiring board having a conductive circuit pattern including a hole part, characterized by including a hole filling process comprising (a) a step of filling the hole part mentioned above with the liquid thermosetting resin composition mentioned above, (b) a step of heating the composition filling the hole thereby effecting precure of the composition, (c) a step of polishing and removing the part of the precured composition protruding from the surface defining the hole part, and (d) a step of further heating the precured composition till final curing.

In a preferred embodiment, the precuring step mentioned above is carried out by at least two stages so distinguished that a heating temperature in the succeeding stage is higher than that in the preceding stage.

The term "precure" or "precured product" as used in this specification refers to the state in which the degree of conversion of epoxy is in the range of from 80% to 97%.

By the process as described above, it is possible to effect the filling of holes such as via holes and through-holes of a printed wiring board with the composition with high operational efficiency and to produce with high productivity a highly reliable printed wiring board which is excellent in various properties such as insulating reliability, resistance to heat, resistance to moisture, and PCT resistance without suffering from such defects as the occurrence of cracks and deterioration of insulation reliability during the course of heat cycle and the ply separation of the insulating resin layer or cover plating formed on the cured products filled in the hole parts.

DETAILED DESCRIPTION OF THE INVENTION

Figure 1:
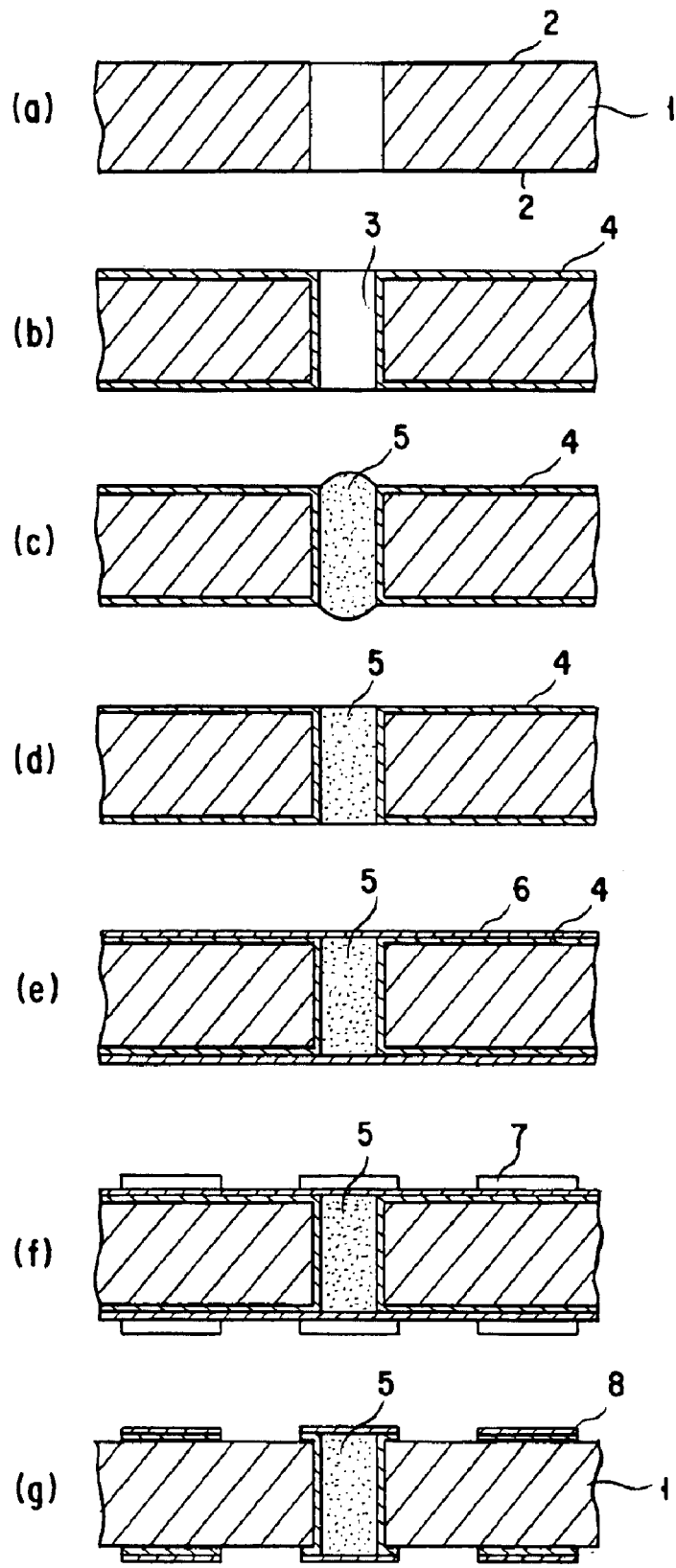
FIG. 1 is a cross-sectional view schematically illustrating one embodiment of the process for producing a printed wiring board according to the present invention till the middle step.

The characteristic features of the liquid thermosetting resin composition of the present invention reside in the fact that the composition comprises (A) an epoxy resin which is in a liquid state at room temperature, (B) a curing catalyst, and (C) a filler and exhibits a viscosity at 25° C. of not more than 1,500 dPa.s, a gel time of not less than 300 seconds at a temperature at which the composition exhibits a melt viscosity of not more than 10 dPa.s, and a gel time at 130° C. of not more than 600 seconds.

The present inventors, after pursuing a diligent study on the causes of the occurrence of voids and cracks in the cured products of the epoxy resin composition filled in such hole parts as through-holes and via holes in a printed wiring board, have found that the precuring rate of the filled epoxy resin composition has a relation to the retention of voids and the occurrence of cracks on precuring. The present inventors have further continued to study this relation and found that if the liquid thermosetting resin composition exhibits a viscosity at 25° C. of not more than 1,500 dPa.s, a gel time of not less than 300 seconds at a temperature at which the composition exhibits a melt viscosity of not more than 10 dPa.s, and a gel time of not more than 600 seconds at 130° C. which is a usual precuring temperature, it exhibits a suitable precuring rate and does not cause the retention of voids and the occurrence of cracks. As a result, the present invention has been perfected.

Specifically, the first feature of the liquid thermosetting resin composition of the present invention resides in the fact that its viscosity at 25° C. is not more than 1,500 dPa.s. Owing thereto, the composition exhibits excellent filling properties into hole parts such as through-holes and via holes of a printed wiring board and enables hole parts such as, for example, via holes in a printed wiring board to be filled with high operational efficiency by the known and commonly utilized technique such as, for example, the screen printing process or roll coating process.

The second feature of the liquid thermosetting resin composition of the present invention resides in the fact that its gel time at a temperature at which the composition exhibits a melt viscosity of not more than 10 dPa.s is not less than 300 seconds. By adjusting the gel time at a temperature at which the composition exhibits a melt viscosity of not more than 10 dPa.s to a level of not less than 300 seconds, it is possible to securely remove voids.

Further, the third feature of the liquid thermosetting resin composition of the present invention resides in the fact that its gel time at 130° C. is not more than 600 seconds. If this gel time is so prolonged as to exceed 600 seconds, it tends to bring about occurrence of cracks on precuring.

Incidentally, if the gel time mentioned above becomes shorter, it tends to bring about retention of voids. However, the retention of voids can be prevented by regulating the gel time at a temperature at which the composition exhibits a melt viscosity of not more than 10 dPa.s to a level of not less than 300 seconds. That is to say, by regulating both the upper limit of the gel time at 130° C. and the lower limit of the gel time at a temperature at which the composition exhibits the melt viscosity of not more than 10 dPa.s, it is possible to acquire a proper precuring rate and to prevent the retention of voids and the occurrence of cracks.

In a preferred embodiment of the liquid thermosetting resin composition of the present invention, it contains a spherical filler and a ground filler, preferably a spherical fine filler, a spherical coarse filler and a ground filler in combination, as the filler (C). This feature makes possible to incorporate the filler in the composition in a large amount (closest packing) without impairing the filling properties (operational efficiency) into through-holes etc. and, when the hole part is filled with the composition, to form a precured product part sticking out of the surface defining the hole part in such a protruding state as to be easily polished and removed, owing to the presence of the ground filler, and thus exhibiting excellent polishability.

In a further preferred embodiment of the liquid thermosetting resin composition of the present invention, it contains a coupling agent (D) such as, for example, a titanate coupling agent, a silane coupling agent, and an aluminum coupling agent. When the coupling agent is present in the liquid thermosetting resin composition, the wettability of the filler by the resin is improved and the viscosity of the composition decreases. Therefore, it is possible to incorporate the filler in the composition in a large amount while maintaining the viscosity and the gel time at required level specified by the present invention. Further, it is easy to adjust the viscosity of the composition even when the filler is incorporated therein in a large amount and the retention of voids and the occurrence of cracks can be considerably reduced.

In a process for producing a printed wiring board by the use of the liquid thermosetting resin composition of the present invention, a hole filling process of the through-holes, via holes, etc. is performed by the two stage curing comprising the precuring and the final curing (finish curing). Therefore, the composition changes into a polishable state after precuring and the unnecessary part of the precured product can be very easily polished and removed by physical polishing.

Further, the precured product of the epoxy resin shrinks only slightly during the course of final curing and thus the finally cured product has advantages of excelling in various properties such as insulating reliability, resistance to heat, and resistance to moisture and exhibiting a low linear expansion coefficient, a low water absorption, and a small volume expansion under the conditions of high temperature and high humidity. Therefore, it is possible to produce a multi-layer printed wiring board of highly reliable performance.

In a further preferred embodiment of the process for producing a printed wiring board of the present invention, the precuring step mentioned above is carried out by at least two stages so distinguished that a heating temperature in the succeeding stage is higher than that in the preceding stage. Specifically, in the primary precuring the composition is firstly subjected to a heating treatment to such an extent that the cross-linking reaction of the epoxy resin will not take place and voids are removed at a temperature at which the composition exhibits a melt viscosity of not more than 10 dPa.s. Then, in the secondary precuring the composition is subjected to a heating treatment at a temperature at which the cross-linking reaction of the epoxy resin will take place till a polishable state (epoxy conversion: 80% to 97%). For instance, prior to the precuring (secondary precuring) at 130° C. which is a usual precuring temperature, the primary precuring is carried out at a temperature lower than this temperature, for example at about 100° C. By performing the multi-stage precuring in such a manner, it is made possible to securely remove bubbles and easily suppress the retention of voids and the occurrence of cracks on precuring.

Now, the constituent components of the liquid thermosetting resin composition of the present invention will be described in detail below.

First, the epoxy resin (A) mentioned above can be any of the well known epoxy resins. As concrete examples of the epoxy resin, epoxy resins of various species represented by the bisphenol A type, bisphenol F type, bisphenol S type, phenol novolak type, and cresol novolak type may be cited. The epoxy resins of these species may be used either singly or in the form of a combination of two or more members, depending on the requirement for improving the special qualities of a coating film to be obtained. However, the viscosity of the composition should be not more than 1,500 dPa.s as the viscosity at 25° C.

Incidentally, other thermosetting resins such as a phenolic resin may be used insofar as the above viscosity range is maintained.

The curing catalyst (B) mentioned above is not limited to a particular one and can be any of the curing catalysts which fulfill the requirement that they be effective in promoting the curing reaction of an epoxy resin in such a proportion that the gel time at 130° C. becomes a level of not more than 600 seconds depending on the epoxy resin to be used, as described above. Among other curing catalysts, imidazole derivatives prove to be preferable in terms of the easiness of adjustment of the gel time at 130° C. to a level of not more than 600 seconds. As examples thereof, 2-methylimidazole, 4-methyl-2-ethylimidazole, 2-phenylimidazole, 4-methyl-2-phenylimidazole, 1-benzyl-2-methylimidazole, 2-ethylimidazole, 2-isopropylimidazole, 1-cyanoethyl-2-methylimidazole, 1-cyanoethyl-2-ethyl-4-methylimidazole, 1-cyanoethyl-2-undecylimidazole, etc. may be cited. As the concrete examples thereof which are commercially available, imidazoles such as the product names 2E4MZ, C11Z, C17Z, and 2PZ, AZINE compounds of imidazoles such as the product names 2MZ-A and 2E4MZ-A, isocyanurates of imidazoles such as the product names 2MZ-OK and 2PZ-OK, imidazole hydroxymethyl compounds such as the product names 2PHZ and 2P4MHZ (the aforementioned commercial products invariably manufactured by Shikoku Kasei Kogyo K.K.) may be cited.

Besides the imidazoles mentioned above, dicyandiamide and derivatives thereof, melamine and derivatives thereof, diaminomaleonitrile and derivatives thereof, amines such as diethylene triamine, triethylene tetramine, tetramethylene pentamine, bis(hexamethylene) triamine, triethanol amine, diaminodiphenyl methane, and organic acid hydrazides, 1,8-diazabicyclo[5.4.0]undecene-7 (product name "DBU", manufactured by Sun-Apro K.K.), 3,9-bis(3-aminopropyl)-2,4,8,10-tetraoxaspiro[5.5]undecane (product name "ATU", manufactured by Ajinomoto Co., Inc.), and organic phosphine compounds such as triphenyl phosphine, tricyclohexyl phosphine, tributyl phosphine, and methyl diphenyl phosphine may be used either singly or in the form of a combination of two or more members in such a proportion that the gel time at 130° C. becomes a level of not more than 600 seconds, depending on the epoxy resin to be used. When aromatic amines are used, however, the resin composition shrinks largely after thermal curing and the hardened composition tends to give birth to a gap between itself and the wall of the through-hole and voids in the cured product in the filled hole after cure. Accordingly, it is undesirable to use the aromatic amines. Among other curing catalysts, dicyandiamide, melamine, guanamine and derivatives thereof such as acetoguanamine, benzoguanamine, and 3,9-bis[2-(3,5-diamino-2,4,6-triazaphenyl)ethyl]-2,4,8,10-tetraoxaspiro[5.5]undecane, and organic acid salts and epoxy adducts of these compounds are known to possess the ability to adhere fast to copper and the ability to rustproof copper and are capable of not only functioning as a curing catalyst for the epoxy resin but also contributing to the protection of the copper of a printed wiring board against discoloration.

The amount of the curing catalyst (B) mentioned above to be incorporated in the composition has only to suffice such a quantitative proportion that the gel time at 130° C. becomes a level of not more than 600 seconds, depending on the epoxy resin to be used. In general, it is proper to be not less than 3 parts by weight and not more than 20 parts by weight, preferably not less than 5 parts by weight and not more than 15 parts by weight, based on 100 parts by weight of the epoxy resin (A) mentioned above. If the amount of the curing catalyst (B) to be incorporated is less than 3 parts by weight, in general the precuring rate of the resin composition becomes so slow that the gel time exceeds 600 seconds and the shortage will tend to cause the undesirable retention of voids and occurrence of cracks. Conversely, if the curing catalyst (B) is incorporated in the composition in an unduly large amount exceeding 20 parts by weight, in general the precuring rate of the resin composition becomes too high and the excess will tend to cause the undesirable retention of voids.

The filler (C) mentioned above can be any of the heretofore known inorganic fillers and organic fillers and are not limited to particular substances. Particularly in the liquid thermosetting resin composition of the present invention, the filler (C) is preferred to include a spherical filler and a ground filler in order to make possible to incorporate a large amount of the filler in the composition without impairing the filling properties (operational efficiency) into through-holes etc. In a particularly preferred embodiment, the spherical filler includes a spherical fine filler and a spherical coarse filler.

Of these fillers, the spherical fine filler and the spherical coarse filler play the roles in making possible to incorporate the filler in a large amount and the ground filler plays a role to prevent the deterioration of filling properties due to the change in viscosity or thixotropy. In order to effectively perform these duties, particularly, the average particle diameter of the spherical fine filler mentioned above is preferred to be not less than 0.1 μm and less than 3 μm, more preferably in the range of 1.0 to 2.0 μm, the average particle diameter of the spherical coarse filler mentioned above is preferred to be not less than 3 μm and less than 25 μm, more preferably in the range of 4 to 10 μm, and the average particle diameter of the ground filler mentioned above is preferred to be not more than 25 μm, more preferably not more than 10 μm. Incidentally, the difference between the average particle diameter of the spherical fine filler and the average particle diameter of the spherical coarse filler is preferred to be in the range of 2 to 12 μm.

The filler (C) having such a morphological feature may be any of the substances which are used as the standard fillers for resin. For example, extenders such as silica, precipitated barium sulfate, talc, calcium carbonate, silicon nitride, and aluminum nitride and metallic powders of copper, tin, zinc, nickel, silver, palladium, aluminum, iron, cobalt, gold, platinum, etc. may be cited.

Such fillers may be classified into a spherical filler and a ground filler having a shape other than a spherical shape, depending on the shape. The spherical filler is classified into a spherical fine filler and a spherical coarse filler according to the average particle diameter. The spherical fine filler and the spherical coarse filler are preferred to be spherical silica. Among other fillers (inorganic fillers) mentioned above, silica proves to be particularly excellent in low hygroscopicity and low volume expansibility. The silica may be fused silica, crystalline silica, or the mixture thereof.

The shape of the ground filler includes the shape other than a spherical shape, for example a needle-like, plate-like, scale-like, hollow cylindrical, monolithic, hexagonal, cubic, and leaf-like shapes may be cited.

In such fillers, the ratio of the spherical fine filler to the spherical coarse filler to be incorporated is preferred to be 40–10:60–90, more preferably 30–20:70–80, by weight ratio.

The amount of the ground filler to be incorporated in the composition is preferred to be 5 to 20% by weight of the total amount of the fillers. If this proportion is less than 5% by weight, the flowability of the composition will become too large. Conversely, if the proportion exceeds 20% by weight, the flowability of the composition will be impaired. In either case, the filling properties will be impaired.

The total amount of the mixed fillers to be incorporated in the composition is preferred to account for a proportion in the range of 40 to 95% by weight of the total weight of the composition. If this proportion is less than 40% by weight, the shortage will prevent the cured product from exhibiting sufficiently low expansibility and cause it to suffer from deficiency in polishability and fastness of adhesion. Conversely, if the proportion exceeds 95% by weight, the excess will allow no easy conversion of the composition into a liquid paste and prevent the composition from acquiring the printability or the ability to fill holes.

In the liquid thermosetting resin composition of the present invention, it is preferable that a coupling agent (D) such as, for example, a titanate coupling agent, a silane coupling agent, and an aluminum coupling agent be added thereto besides the components mentioned above. A method for addition of such a coupling agent may be either of the method of directly adding it into the composition or the method of adding the filler (C) pretreated with such a coupling agent into the composition. Among other coupling agents, the titanate coupling agent proves to be preferable.

As the titanate coupling agents, tetranormalbutyl titanate, isopropyltris(dioctylpyrophosphate) titanate, isopropyltri-n-dodecylbenzenesulfonyl titanate, tetra(2,2-diallyloxymethyl-1-butyl)bis(di-tridecyl)phosphite titanate, tetraisopropylbis(dioctylphosphite) titanate, tetraoctylbis (ditridecylphosphite) titanate, isopropyltriisostealoyl titanate, bis(dioctylpyrophosphate)ethylene titanate, isopropyltri(N-aminoethyl-aminoethyl) titanate, etc. may be cited.

As the silane coupling agent, all the known compounds having at one terminal thereof an alkoxysilane group containing at least two alkoxy groups such as methoxy group, ethoxy group, propoxy group, and butoxy group bonded thereto and at the other terminal an amine end group such as amino group and urea group may be used. As concrete examples thereof, γ-ureidopropyl triethoxy silane, γ-aminopropyl triethoxy silane, and N-β-(aminoethyl)-γ-aminopropyl triethoxy silane, for example, may be cited.

As the aluminum coupling agents, (alkylacetoacetate) aluminum diisopropylate etc. may be cited.

These coupling agents (D) may be used either singly or in the form of a combination of two or more members. The amount thereof to be incorporated in the composition is preferred to be in the range of 0.1 to 5 parts by weight, based on 100 parts by weight of the filler (C) mentioned above.

Though the liquid thermosetting resin composition of the present invention does not always require to use a diluting solvent because the epoxy resin is properly selected so that the viscosity of the composition should be not more than 1,500 dPa.s, it may incorporate a diluting solvent for the purpose of adjusting the viscosity of itself to such an extent that voids would not occur.

As the diluting solvents, ketones such as methyl ethyl ketone and cyclohexanone; aromatic hydrocarbons such as toluene, xylene, and tetramethyl benzene; glycol ethers such as methyl cellosolve, butyl cellosolve, methyl carbitol, butyl carbitol, propylene glycol monomethyl ether, dipropylene glycol monoethyl ether, and triethylene glycol monoethyl ether; esters such as ethyl acetate, butyl acetate, and acetates of glycol ethers mentioned above; alcohols such as ethanol, propanol, ethylene glycol, and propylene glycol; aliphatic hydrocarbons such as octane and decane; and petroleum solvents such as petroleum ether, petroleum naphtha, hydrogenated petroleum naphtha, and solvent naphtha may be cited.

The liquid thermosetting resin composition of the present invention, when necessary, may further incorporate therein any of known and commonly used coloring agents such as phthalocyanine blue, phthalocyanine green, iodine green, disazo yellow, crystal violet, titanium oxide, carbon black, and naphthalene black, any of known and commonly used thermal polymerization inhibitors such as hydroquinone, hydroquinone monomethyl ether, tert-butyl catechol, pyrogallol, and phenothiazine which are used for imparting the stability needed during storage, any of known and commonly used thickening agent or thixotropic agent such as clay, kaolin, organobentonite, and montmorillonite, silicone type, fluorine type, or macromolecular type antifoaming agent and/or leveling agent, adhesiveness imparting agent such as imidazole-based compound, thiazole-based compound, triazole-based compound, and silane coupling agent, or any other known and commonly used additives. Particularly, the use of an organobentonite is desirable from the viewpoint of that a precured product part sticking out of the surface defining the hole part will be formed in such a protruding state as to be easily polished and removed and thus exhibits excellent polishability.

The liquid thermosetting filling composition of the present invention which is obtained as described above can be easily made to fill the hole parts such as via holes and through-holes in printed wiring boards by the use of such a conventional technique as, for example, the screen printing process, roll coating process, or die coating process.

Subsequently, the composition presently filling the hole parts is heated for the sake of precuring at a temperature of about 90 to 130° C. for about 30 to 90 minutes, for example. Preferably, a primary precuring is carried out at a temperature of about 90 to 110° C. and thereafter a secondary precuring is carried out at a temperature of about 110 to 130° C. Since the resultant precured product has relatively low hardness, the unnecessary parts thereof which protrude from the surfaces of the board can be easily removed by physical polishing to form flat planes.

Thereafter, the precured composition is again heated for the sake of final curing (finish curing) at a temperature of about 140 to 180° C. for about 30 to 90 minutes. During this step, since the liquid thermosetting resin composition hardly expands or shrinks owing to its low expansibility, it ultimately forms a finished product which enjoys a satisfactory dimensional stability and excels in low hygroscopicity, fastness of adhesion, and electrical insulation properties. The cured product thus obtained excels in thermal reliability, resistance to heat, and resistance to moisture, exhibits low volume expansion even under the conditions of high temperature and high humidity and thus excellent PCT resistance. Incidentally, the hardness of the precured product mentioned above can be controlled by varying the heating time and the heating temperature used for the precuring.

In accordance with the hole filling process of a printed wiring board by the use of the liquid thermosetting resin composition of the present invention, it is possible to effect the filling of the hole parts of the printed wiring board with the composition with high operational efficiency and high productivity and to produce the cured products possessed of excellent properties and physical properties after filling in holes.

Owing to such excellent special qualities as mentioned above, the liquid thermosetting resin composition of the present invention can be advantageously used not only for the composition intended for permanently filling holes in printed wiring boards but also for other applications such as, for example, solder resists, interlaminar insulating materials, and sealing materials for IC packages.

Now, a method of producing a printed wiring board according to the present invention will be specifically described with reference to the attached drawings. Incidentally, the method described below is one example of a method of producing a multi-layer printed wiring board by a semi-additive process. In the method of producing a printed wiring board according to the present invention, however, heretofore known various methods such as a fully additive process, a multi-lamination process, and a pin lamination process may be adopted.

(1) Formation of Through-Holes

First, through holes are formed in a substrate 1 laminated with a copper foil 2 by the use of a drill, as shown in FIG. 1(*a*), and the electroless plating is performed on the wall surfaces of the through-holes and the surface of the copper foil to form through-holes 3. As the substrate, resin substrates such as a glass-epoxy substrate, a polyimide substrate, a bismaleimide-triazine resin substrate, and a fluoroplastic substrate, copper-clad laminates of these resin substrates, ceramic substrates, metal substrates, and the like may be used. In case the substrate is possessed of poor throwing power as a fluoroplastic substrate, it is subjected to the surface modification with a pretreatment agent comprising an organometallic sodium or by a plasma treatment.

Next, for the purpose of thick plating, the electroplating is carried out to form a deposit film 4 on the surface of the substrate and the inner walls of the through-holes 3, as shown in FIG. 1(b). This electroplating is preferred to be the copper plating.

(2) Filling of Holes

The through-holes 3 formed in step (1) mentioned above are filled with a liquid thermosetting resin composition of the present invention, as shown in FIG. 1(c). Specifically, this filling step is easily carried out by superposing on the substrate a mask having apertures perforated so as to correspond to the through-holes and applying the composition by the printing technique etc. or by dot printing method.

Next, the filled composition is precured by such a method as described hereinbefore and then the unnecessary parts of the precured products 5 which protrude from the through-holes are removed by polishing to form a flat surface. The polishing may be advantageously performed by the use of a belt sander, or by buffing and the like. Thereafter, the precured products are further heated for the sake of final curing and, when occasion demands, the exposed surfaces of the cured products 5 are subjected to a roughening treatment. If the cured products contain therein the dispersed particles which are soluble in a roughening treatment liquid, these particles are dissolved out by this roughening treatment. As a result, the formed rough surfaces are excellent in an anchoring effect and thus exhibits excellent adhesiveness to a deposit film to be formed on the subsequent step.

(3) Formation of Conductive Circuit Layer

After catalytic nuclei are imparted to the surface of the substrate which has undergone the filling of through-holes in step (2) mentioned above, the substrate is subjected to electroless plating and electroplating to form a deposit film 6 as shown in FIG. 1(e). Thereafter, an etching resist 7 is formed on the substrate as shown in FIG. 1(f), and the parts on which the resist is not formed are etched. Then, the etching resist 7 is peeled off the substrate to form a conductive circuit layer 8 as shown in FIG. 1(g). As the etching liquid, a heretofore known liquid such as an aqueous solution of sulfuric acid-hydrogen peroxide, an aqueous solution of persulfate such as ammonium persulfate, sodium persulfate, and potassium persulfate, and an aqueous solution of ferric chloride or cupric chloride may be used.

(4) Formation of Interlaminar Resin Insulating Layer

Figure 2:
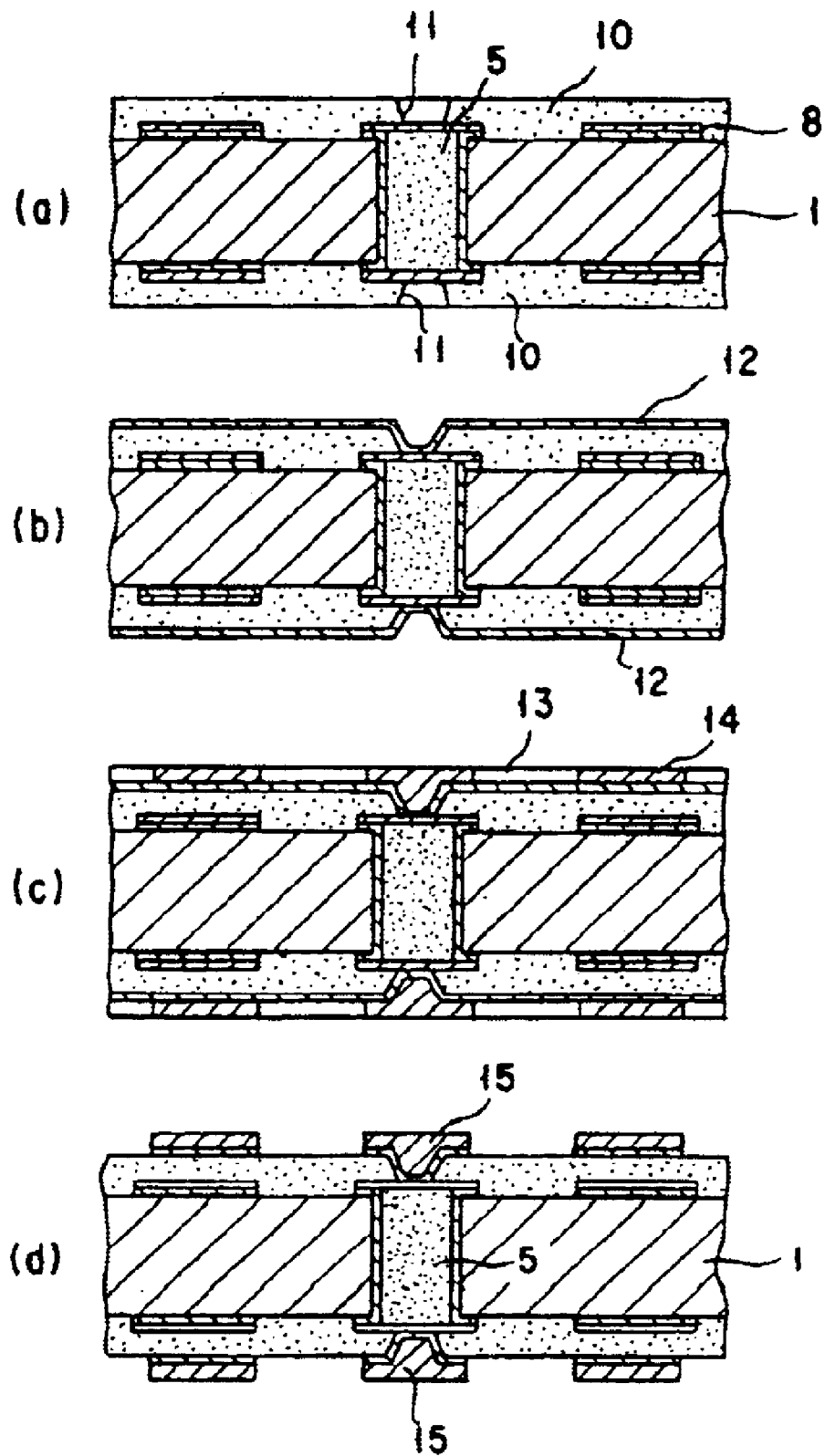
FIG. 2 is a cross-sectional view schematically illustrating the subsequent steps of the embodiment of the process for producing a printed wiring board according to the present invention shown in FIG. 1.

Then, after the surface of the conductive circuit layer is treated, as occasion demands, by such a method as blackening (oxidation)-reduction treatment, an interlaminar resin insulating layer 10 is formed on the substrate as shown in FIG. 2(a). As the interlaminar resin insulating layer, a thermosetting resin, a photocurable resin, a thermoplastic resin, a composite or mixture of these resins, a composite of glass cloth impregnated with a resin, and an adhesive for electroless plating may be used. The interlaminar resin insulating layer 10 is formed by applying an uncured liquid of the composition of the above resin to the substrate or laminating a film of resin on the substrate by hot pressing.

(5) Formation of Via Holes

Next, apertures 11 are formed in the interlaminar resin insulating layer 10 as shown in FIG. 2(a). The drilling of the apertures 11 is carried out by an exposure to light and developing treatment when the interlaminar resin insulating layer 10 is formed of a photosensitive resin, or with a laser beam when it is formed of a thermosetting resin or a thermoplastic resin. As the laser beam to be used herein, a carbonic acid gas laser, an ultraviolet light laser, an excimer laser, etc. may be cited. When the drilling is carried out by a laser beam, a desmear treatment may be performed. This desmear treatment can be effected by the use of an oxidizing agent consisting of an aqueous solution of chromic acid, a permanganate, etc. or alternatively by the treatment with oxygen plasma.

After the apertures 11 are formed, the surface of the interlaminar resin insulating layer 10 is subjected to a roughening treatment, as occasion demands.

Then, after catalytic nuclei for electroless plating are imparted to the surface of the interlaminar resin insulating layer 10, the substrate is subjected to electroless plating to form a deposit film 12 on its entire surface as shown in FIG. 2(b).

And a plating resist layer 13 is formed on the deposit film 12 as shown in FIG. 2(c). Preferably, the plating resist layer is formed by laminating a photosensitive dry film on the deposit film and subjecting to the exposure to light and development treatments.

Further, for the purpose of thick plating of the conductive circuit parts, the electroplating is carried out to form a deposit film 14, as shown in FIG. 2(c).

Then, after the plating resist layer 13 is peeled off the substrate, parts of the electroless deposit film 12 which have lain under the plating resist are dissolved out by etching to form independent conductive circuits (including via holes 15) as shown in FIG. 2(d). As the etching liquid, an aqueous solution of sulfuric acid-hydrogen peroxide, an aqueous solution of persulfate such as ammonium persulfate, sodium persulfate, and potassium persulfate, an aqueous solution of ferric chloride or cupric chloride, and the like may be used.

Figure 3:
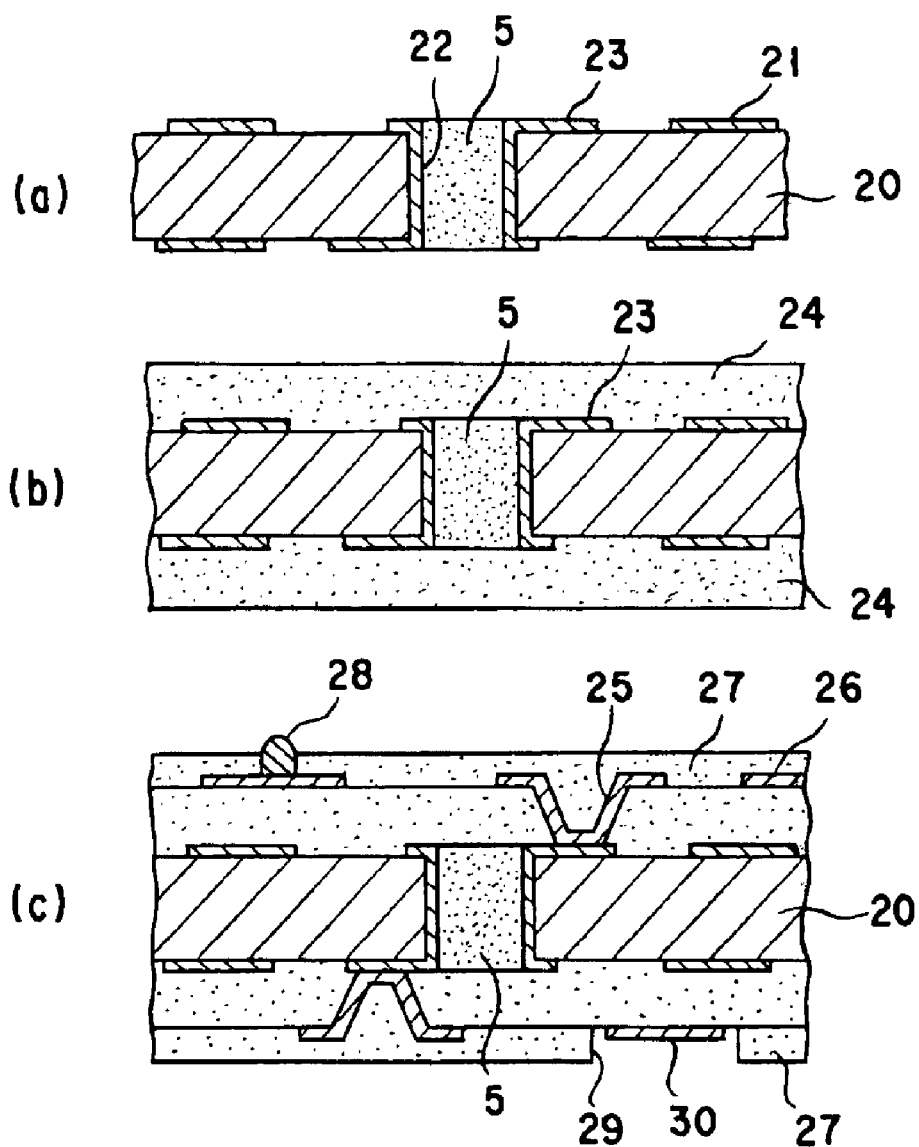
FIG. 3 is a cross-sectional view schematically illustrating another embodiment of the process for producing a printed wiring board according to the present invention.

FIG. 3 shows schematically steps of another embodiment of the process for producing a printed wiring board. After completion of the core substrate preparation step as shown in FIG. 1(d) mentioned above, the etching is performed on the conductive layers on both sides of a core substrate 20 according to a prescribed pattern. By this step, first conductive circuit layers 21 of a prescribed pattern are formed on both sides of the core substrate 20 and lands 23 are simultaneously formed on parts of the conductive circuit layers connected to a through-hole 22, as shown in FIG. 3(a). During this step, since the conductive layers have been simultaneously polished in the step of polishing of the cured products 5 mentioned above to give the uniform thickness and the plain surface, scattering or irregularity of etching will occur scarcely and thus the conductive circuit layers of a uniform thickness can be obtained.

Then, interlaminar resin insulating layers 24 are formed on both upper and lower sides of the substrate 20 as shown in FIG. 3(b). Further, via holes 25 are formed in the resin insulating layer at positions just above the lands 23 mentioned above by the known photolithography technique as shown in FIG. 3(c). Then, copper deposit layers are formed in via holes and on the interlaminar resin insulating layers by copper plating, the etching resists are formed thereon, and thereafter the substrate is subjected to etching. By these steps, second conductive circuit layers 26 are formed on the interlaminar resin insulating layers 24 as shown in FIG. 3(c). The first and second conductive circuit layers 21, 26 are electrically connected to each other through the medium of via holes 25 and the conductive circuit layers 21, 21 on both sides of the substrate are electrically connected to each other via through-holes 22.

Then, solder resist layers 27 are formed on the resin insulating layers 24 and the second conductive circuit layers 26 and a solder bump 28 is formed in the upper resist layer so as to penetrate this layer and raise from the surface of the conductive circuit layer, as shown in FIG. 3(c). The surface of the conductive circuit layer 30 exposed from the opening 29 formed between the lower resist layers is subjected to Au and Ni plating and used as a connecting terminal of a multi-layer wiring board obtained. The solder bump 28 mentioned above is used for the connection of an electronic part such as, for example, an IC element which is disposed on the main surface of the wiring board.

Now, the present invention will be described specifically below with reference to working examples and comparative examples. The word "parts" mentioned below refers invariably based on weight unless otherwise specified.

EXAMPLES 1–12 AND COMPARATIVE EXAMPLES 1–5

Thermosetting resin compositions were obtained by mixing preparatorily an epoxy resin (manufactured by Japan Epoxy Resin K.K., product name: EPIKOTE 828 or EPIKOTE 807) which is in a liquid state at room temperature with other components listed in Table 1 described below in a proportion shown in Table 1 and kneading the resultant mixture with a three-roll mill.

Melt Viscosity Measurement:
Measuring device: Shimadzu Flow Tester CFT-100D (manufactured by Shimadzu Seisakusho K.K.)
Measuring Method:
(1) Set a sample carrier at a measuring temperature (100° C.).
(2) Weigh out 2 ml of a sample with a syringe.
(3) Pour the sample to the sample carrier, preheat it for 5 minutes, and then apply a load by the use of a piston.
Measuring Conditions:
Load: 1 kg
Hole diameter of die: 1.0 mm
Length of die: 10 mm
Gel Time Measurement:
Measuring device: automatic gelation tester
Measuring method: 0.4 ml of a sample was weighed out and placed on a iron plate kept at a measuring temperature (100° C., 130° C.). A rod made of polytetrafluoroethylene was rotated on the sample and the time during which the torque reaches to a value of 30% of the maximum torque was measured. This value was defined as the gel time.

TABLE 1

| Components | Example | | | | | | | | | | | | Comparative Example | | | | |
|---|---|---|---|---|---|---|---|---|---|---|---|---|---|---|---|---|---|
| (parts by weight) | 1 | 2 | 3 | 4 | 5 | 6 | 7 | 8 | 9 | 10 | 11 | 12 | 1 | 2 | 3 | 4 | 5 |
| Bisphenol A type epoxy resin | 100 | 100 | 50 | — | 100 | 100 | 100 | 100 | 50 | — | 100 | 100 | 100 | 100 | 100 | 100 | 100 |
| Bisphenol F type epoxy resin | — | — | 50 | 100 | — | — | — | — | 50 | 100 | — | — | — | — | — | — | — |
| 2MZ-A | 6 | 6 | 6 | 6 | 6 | 9 | — | 6 | 6 | 6 | 6 | 6 | — | — | 6 | 6 | 6 |
| Dicyandiamide | — | — | — | — | — | — | 7 | — | — | — | — | — | — | — | — | — | — |
| Triethylene tetramine | — | — | — | — | — | — | 2 | — | — | — | — | — | 10 | — | — | — | — |
| 2PHZ | — | — | — | — | — | — | — | — | — | — | — | — | — | 6 | — | — | — |
| Silica | 164 | 164 | 164 | 164 | 82 | 164 | 164 | 164 | 164 | 164 | 246 | 164 | 164 | 164 | 246 | — | 164 |
| Organobentonite | 4 | 4 | 4 | 4 | 2 | 4 | 4 | 4 | 4 | 4 | 6 | 4 | 4 | 4 | 6 | — | 4 |
| Titanate coupling agent | — | — | — | — | — | — | — | 1 | 1 | 1 | 2 | — | — | — | — | — | — |
| Silane coupling agent | — | — | — | — | — | — | — | — | — | — | — | 1 | — | — | — | — | — |
| Solvent | — | 2 | — | — | — | — | — | — | — | — | — | — | — | — | — | — | 15 |

Remarks
Bisphenol A type epoxy resin: manufactured by Japan Epoxy Resin K.K., product name EPIKOTE 828
Bisphenol F type epoxy resin: manufactured by Japan Epoxy Resin K.K., product name EPIKOTE 807
2MZ-A: curing catalyst manufactured by Shikoku Kasei Kogyo K.K., 2,4-diamino-6-[2'-methylimidazolyl-(1')]-ethyl-S-triazine, product name Curezole 2MZ-A
Dicyandiamide: curing catalyst manufactured by Japan Epoxy Resin K.K., product name FP-10
Triethylenetetramine: curing catalyst manufactured by Sumitomo Seika K.K.
2PHZ: curing catalyst manufactured by Shikoku Kasei Kogyo K.K., 2-phenyl-4,5-dihydroxymethylimidazole, product name Curezole 2PHZ
Titanate coupling agent: coupling agent manufactured by Nippon Soda K.K., product name A-1
Silane coupling agent: coupling agent manufactured by Nippon Yunika K.K., product name A-187
Solvent: ethoxyethoxyethyl acetate manufactured by Osaka Organic Chemistry Industries K.K., product name ethyl acetate Jukizole Each of the liquid thermosetting resin compositions obtained in Examples 1–12 and Comparative Examples 1–5 as described was tested for a viscosity at 25° C., a melt viscosity at 100° C., a gel time at 100° C., and a gel time at 130° C. by the following methods and cured products filled in hole parts in a wiring board were evaluated as to cracks, retention of voids, filling properties, polishability, shrinkage on curing, and volume expansion by the following methods. The test results are shown in Table 2.

Viscosity at 25° C.:

0.2 ml of a sample taken from the composition was subjected to measurement by the use of a cone plate type viscometer (manufactured by Toki Sangyo K.K.) and the value determined at 25° C. for 30 seconds with a rotational speed of 5 r.p.m. was defined as the viscosity.

Cracks:

On a glass-epoxy substrate (thickness of plate: 1.6 mm, diameter of through-hole: 0.3 mm) having through-holes formed in advance therein by panel plating, each composition was applied by the screen printing method to fill the through-holes. The resultant substrate was then placed in a hot air circulating drying oven and kept therein at 100° C. for 20 minutes, then increased to 130° C. and precured at this temperature for 45 minutes to obtain an evaluation sample (I). Thereafter, the evaluation sample (I) was severed at the through-hole part and the cross section was observed through an optical microscope. The through-holes having cracks (breakage) occurred in the sample were defined as N.G. and the proportion of N.G. to the number of holes observed was calculated. The criterion for evaluation is as follows.

○: Degree of occurrence of cracks is 0%.
Δ: Degree of occurrence of cracks is not more than 50%.

x: Degree of occurrence of cracks exceeds 50%.
Retention of Voids:
The evaluation sample (I) mentioned above was severed at the through-hole part and the cross section was observed through an optical microscope to confirm the presence or absence of voids in through-holes. The through-holes including retained voids were defined as N.G. and the proportion of N.G. to the number of holes observed was calculated.
○: Degree of retention of voids is 0%.
Δ: Degree of retention of voids is not more than 50%.
x: Degree of retention of voids exceeds 50%.
Filling properties:
On a glass-epoxy substrate (thickness of plate: 1.6 mm, diameter of through-hole: 0.3 mm) having through-holes formed in advance therein by panel plating, each composition was applied by the screen printing method to fill the through-holes under the following conditions. The resultant substrate was then placed in a hot air circulating drying oven and kept therein at 100° C. for 20 minutes, then increased to 130° C. and precured at this temperature for 45 minutes. Thereafter, the substrate was severed at the through-hole part and the cross section was observed through an optical microscope to confirm the degree of filling of the composition in the through-holes.
Print: metal mask (thickness of metal: 0.1 mm)
Mounting angle of squeegee: 75°
Printing speed: 3.0 cm/sec.
Amount of drop-in: 2.5 mm
The criterion for evaluation is as follows.
○: Complete filling in through-holes
x: Insufficient filling
Polishability:
The evaluation sample (I) mentioned above was physically polished with a buff of single shaft for resin buffing corresponding to #320 by a buffing device to remove the unnecessary cured parts of the precured product after precuring. The easiness of removal of the unnecessary parts of the precured products was evaluated by the number of passes till the complete removal. The criterion for evaluation is as follows.
○: Not more than two passes
Δ: Three or four passes
x: More than five passes
Shrinkage on Curing:
The evaluation sample (I) mentioned above was physically polished with a buff of single shaft for resin buffing corresponding to #320 by a buffing device to remove the unnecessary cured parts of the precured product after precuring, thereby smoothing the planes thereof. The sample thus polished was placed in a hot air circulating drying oven and heated therein at 150° C. for one hour by way of final curing to obtain an evaluation sample (II). This evaluation sample (II) was severed at the through-hole part and the cross section was observed through an optical microscope. The step-like difference from the surface of the substrate due to the depression of the filled composition was defined as the shrinkage on curing and the presence or absence of the shrinkage on curing was evaluated.
Volume Expansion:
A solder resist was applied to the entire surfaces of both surfaces of the evaluation samples (II) mentioned above to form coating films and then subjected to a treatment under the conditions of PCT (121° C., 100% R.H., and the treating time of 96 hours). During this treatment, if the volume expansion of the composition in the through-hole is large, the solder resist just above the through-hole is raised and separated from the substrate. The degree of separation was evaluated by observing through an optical microscope. The criterion for evaluation is as follows.
○: No separation of the solder resist
x: Presence of separation of the solder resist

TABLE 2

| Properties | Example | | | | | | | | |
|---|---|---|---|---|---|---|---|---|---|
| | 1 | 2 | 3 | 4 | 5 | 6 | 7 | 8 | 9 |
| Viscosity at 25° C. [dPa · s] | 1027 | 975 | 830 | 782 | 515 | 1030 | 1112 | 750 | 663 |
| Melt viscosity (100° C.) [dPa · s] | 4.2 | 3.2 | 3.5 | 3.3 | 2.8 | 3.9 | 3.3 | 3.2 | 3.2 |
| Gel time (100° C.) [sec.] | >1800 | >1800 | >1800 | >1800 | >1800 | >1800 | >1800 | >1800 | >1800 |
| Gel time (130° C.) [sec.] | 390 | 492 | 373 | 321 | 491 | 385 | 523 | 370 | 359 |
| Cracks | ○ | ○ | ○ | ○ | ○ | ○ | ○ | ○ | ○ |
| Retention of voids | ○ | ○ | ○ | ○ | ○ | ○ | ○ | ○ | ○ |
| Filling properties | ○ | ○ | ○ | ○ | ○ | ○ | ○ | ○ | ○ |
| Polishability | ○ | ○ | ○ | ○ | ○ | ○ | ○ | ○ | ○ |
| Shrinkage on curing | Non | Non | Non | Non | Non | Non | Non | Non | Non |
| Volume expansion | ○ | ○ | ○ | ○ | ○ | ○ | ○ | ○ | ○ |

| Properties | Example | | | Comparative Example | | | | |
|---|---|---|---|---|---|---|---|---|
| | 10 | 11 | 12 | 1 | 2 | 3 | 4 | 5 |
| Viscosity at 25° C. [dPa · s] | 624 | 1260 | 820 | 915 | 963 | 2130 | 25 | 564 |
| Melt viscosity | 2.9 | 5.0 | 3.5 | 5.4 | 3.3 | 18 | 2.0 | 2.3 |

TABLE 2-continued

| | | | | | | | | |
|---|---|---|---|---|---|---|---|---|
| (100° C.) [dPa · s] | | | | | | | | |
| Gel time (100° C.) [sec.] | >1800 | >1800 | >1800 | 220 | >1800 | >1800 | >1800 | >1800 |
| Gel time (130° C.) [sec.] | 336 | 366 | 356 | 47 | 1343 | 347 | 640 | 670 |
| Cracks | ○ | ○ | ○ | ○ | X | ○ | X | X |
| Retention of voids | ○ | ○ | ○ | X | ○ | X | ○ | X |
| Filling properties | ○ | ○ | ○ | ○ | ○ | X | X | ○ |
| Polishability | ○ | ○ | ○ | ○ | ○ | ○ | X | X |
| Shrinkage on curing | Non | Non | Non | Non | Non | Non | Yes | Yes |
| Volume expansion | ○ | ○ | ○ | ○ | X | ○ | X | X |

It is clearly noted from the results shown in Table 2 that the liquid thermosetting resin compositions of Examples 1 to 12 of the present invention showed excellent filling properties into hole parts without suffering the retention of voids and exhibited excellent polishability of the precured products. Further, the cured products obtained did not suffer the occurrence of cracks and shrinkage on curing as well as the volume expansion.

On the contrary, in the liquid thermosetting resin compositions of Comparative Example 1, which gel time was less than 300 seconds at a temperature (100° C.) at which the composition exhibits a melt viscosity of not more than 10 dPa.s, and Comparative Examples 2, 4, and 5, which gel time at 130° C. exceeded 600 seconds, every cured products showed the occurrence of cracks or retention of voids. On the other hand, the composition of Comparative Example 3 which viscosity at 25° C. exceeded 1,500 dPa.s showed poor filling properties into hole parts and retention of voids. Further, although Comparative Examples 1 to 3 using the organobentonite showed excellent polishability, Comparative Example 4 in which no filler was added showed poor polishability and shrinkage occurred on curing.

Furthermore, it is clearly noted from the comparison of Example 11 with Comparative Example 3 that the addition of a coupling agent improved the wettability of a filler by resin and caused the decrease of the viscosity of the liquid thermosetting resin composition. As a result, it was possible to keep such characteristics as viscosity and gel time specified by the present invention even when a large amount of filler was incorporated therein and attain the excellent filling properties into hole parts and the polishability of the precured product without suffering the retention of voids and occurrence of cracks.

As described above, by the use of the liquid thermosetting resin composition of the present invention, it is possible to effect the filling of holes such as through-holes and via holes of a printed wiring board with the composition with high operational efficiency and to produce with high productivity a highly reliable printed wiring board which is excellent in various properties such as insulating reliability, resistance to heat, resistance to moisture, and PCT resistance without suffering from such defects as the occurrence of cracks and deterioration of insulation reliability during the course of heat cycle and the ply separation of the insulating resin layer or cover plating formed on the cured products filled in the hole parts.

While certain specific embodiments and working examples have been disclosed herein, the invention may be embodied in other specific forms without departing from the spirit or essential characteristics thereof. The described embodiments and examples are therefore to be considered in all respects as illustrative and not restrictive, the scope of the invention being indicated by the appended claims rather than by the foregoing description and all changes which come within the meaning and range of equivalency of the claims are, therefore, intended to be embraced therein.

What is claimed is:

1. A liquid thermosetting resin composition for permanently filing a hole in a printed circuit board, consisting essentially of (A) a resin component consisting essentially of an epoxy which is in a liquid state at room temperature, (B) a curing catalyst, and (C) a filler which is characterized by exhibiting a viscosity at 25° C. of not more than 1,500 dPa.s, a gel time of not less than 300 seconds at a temperature at which the composition exhibits a melt viscosity of not more than 10 dPa.s, and a gel time at 130° C. of not more than 600 seconds.

2. The composition according to claim 1, wherein the amount of said curing catalyst (B) to be incorporated therein is 3 to 20 parts by weight, based on 100 parts by weight of said epoxy resin (A).

3. The composition according to claim 1, wherein the amount of said filler (C) to be incorporated therein is 40 to 95% by weight of the total weight of the composition.

4. The composition according to claim 1, wherein said filler (C) includes a spherical filler and a ground filler.

5. The composition according to claim 4, wherein said spherical filler is spherical silica.

6. The composition according to claim 4, wherein the amount of said ground filler to be incorporated therein is 5 to 20% by weight of the total weight of the filler.

7. The composition according to claim 1, wherein said filler (C) includes a spherical fine filler having an average particle diameter of not less than 0.1 μm, and less than 3 μm, a spherical coarse filler having an average particle diameter of not less than 3 μm and less than 25 μm, and a ground filler having an average particle diameter of not more than 25 μm.

8. The composition according to claim 7, wherein the difference between the average particle diameter of said spherical fine filler and the average particle diameter of said spherical coarse filler is in the range of 2 to 12 μm.

9. The composition according to claim 7, wherein both said spherical fine filler and said spherical coarse filler are spherical silica.

10. The composition according to claim 7, wherein the ratio of said spherical fine filler to said spherical coarse filler is 40-10:60-90 by weight ratio.

11. The composition according to claim 1, further comprising (D) a coupling agent.

12. The composition according to claim 11, wherein said coupling agent (D) is a titanate coupling agent.

13. The composition according to claim 11, wherein the amount of said coupling agent (D) to be incorporated therein is 0.1 to 5 parts by weight, based on 100 parts by weight of said filler (C).

14. The composition according to claim 1, further comprising a solvent.

15. The composition according to claim 1, further comprising at least one additive selected from the group consisting of a coloring pigment, a thickening agent, an antifoaming agent, and a leveling agent.

16. A printed wiring board having a conductive circuit formed on a substrate through the medium of an interlaminar resin insulating layer and a hole part filled with a filling material, wherein the filling material filled in said hole part is formed from a cured product of the liquid thermosetting resin composition according to claim 1.

17. A process for the production of a printed wiring board by superposing an interlaminar resin insulating layer and a conductive circuit on a surface of a wiring board having a conductive circuit pattern including a hole part, characterized by including a hole filling process comprising (a) a step of filling said hole part with the liquid thermosetting resin composition according to claim 1, (b) a step of heating said composition filling the hole thereby effecting precure of the composition, (c) a step of polishing and removing part of the precured composition protruding from the surface defining the hole part, and (d) a step of further heating the precured composition till final curing.

18. The process according to claim 17, wherein said precuring step (b) is carried out at a temperature in the range of 90 to 130° C. and said final curing step (d) is carried out at a temperature in the range of 140 to 180° C.

19. The process according to claim 17, wherein said precuring step (b) is carried out by at least two stages so distinguished that a heating temperature in the succeeding stage is higher than that in the preceding stage.

20. The process according to claim 19, wherein said precuring step (b) is carried out by two stages of a primary precuring at a temperature of 90 to 110° C. and a secondary precuring at a temperature of 110 to 130°.

* * * * *

UNITED STATES PATENT AND TRADEMARK OFFICE
CERTIFICATE OF CORRECTION

PATENT NO. : 6,916,873 B2  
DATED : July 12, 2005  
INVENTOR(S) : Rieko Yamamoto et al.

Page 1 of 1

It is certified that error appears in the above-identified patent and that said Letters Patent is hereby corrected as shown below:

<u>Column 18,</u>  
Line 27, "filing" should read -- filling --.

Signed and Sealed this

Twenty-first Day of March, 2006

JON W. DUDAS  
*Director of the United States Patent and Trademark Office*